United States Patent [19]
Kornrumpf et al.

[11] Patent Number: 5,359,496
[45] Date of Patent: Oct. 25, 1994

[54] HERMETIC HIGH DENSITY INTERCONNECTED ELECTRONIC SYSTEM

[75] Inventors: William P. Kornrumpf, Albany; Robert J. Wojnarowski, Ballston Lake; Charles W. Eichelberger, Schenectady, all of N.Y.

[73] Assignee: General Electric Company, Schenectady, N.Y.

[21] Appl. No.: 67,157

[22] Filed: May 26, 1993

Related U.S. Application Data

[63] Continuation of Ser. No. 454,546, Dec. 21, 1989, abandoned.

[51] Int. Cl.⁵ ............................................. H05K 1/11
[52] U.S. Cl. ................................. 361/795; 361/761; 361/749; 361/762; 361/780; 361/807; 361/809
[58] Field of Search .................. 174/50.5, 52.1–52.4, 174/255; 257/678, 684, 700, 723, 724, 758, 778, 781; 361/744, 749, 760, 761, 762, 777, 779, 780, 792–795, 807, 809; 439/68, 77

[56] References Cited

U.S. PATENT DOCUMENTS

| | | | |
|---|---|---|---|
| 3,660,726 | 5/1972 | Ammon et al. | 361/414 X |
| 4,633,573 | 1/1987 | Scherer | 174/52.4 |
| 4,788,382 | 11/1988 | Ahearn et al. | 174/52.4 |
| 4,814,943 | 3/1989 | Okuaki | 361/400 |
| 4,866,501 | 9/1989 | Shanefield | 257/758 |
| 4,880,684 | 11/1989 | Boss et al. | 361/403 X |
| 4,952,286 | 8/1990 | Blandon et al. | 204/15 |
| 4,970,574 | 11/1990 | Tsunenari | 357/65 X |
| 5,023,205 | 6/1991 | Reche | 437/228 |
| 5,048,179 | 9/1991 | Shindo | 257/778 |
| 5,068,708 | 11/1991 | Newman | 257/668 |
| 5,072,263 | 12/1991 | Watanabe et al. | 357/71 X |
| 5,144,747 | 9/1992 | Eichelberger | 29/839 |
| 5,200,810 | 4/1993 | Wojnarowski et al. | 257/668 |

FOREIGN PATENT DOCUMENTS

| | | | |
|---|---|---|---|
| 0101791 | 3/1984 | European Pat. Off. | 257/758 |
| 0257119 | 3/1988 | European Pat. Off. | 361/795 |
| 61-7656 | 1/1986 | Japan | 257/668 |
| 61-7657 | 1/1986 | Japan | 257/668 |
| 63-79365 | 4/1988 | Japan | 257/758 |

*Primary Examiner*—Leo P. Picard
*Assistant Examiner*—Donald A. Sparks
*Attorney, Agent, or Firm*—Geoffrey H. Krauss

[57] ABSTRACT

A body is hermetically sealed by electroplating a hermetic layer over the exterior surface of the body. A hermetic high density interconnect structure is provided by forming a continuous metal layer over the outermost dielectric layer of the multilayer interconnect structure and by disposing that continuous metal layer in a hermetically sealing relation to the substrate of the high density interconnect structure. A variety of techniques may be used for providing electrical feedthroughs between the interior and exterior of the hermetic enclosure as may a pseudo-hermetic enclosure in those situations where true hermeticity is not required.

35 Claims, 6 Drawing Sheets

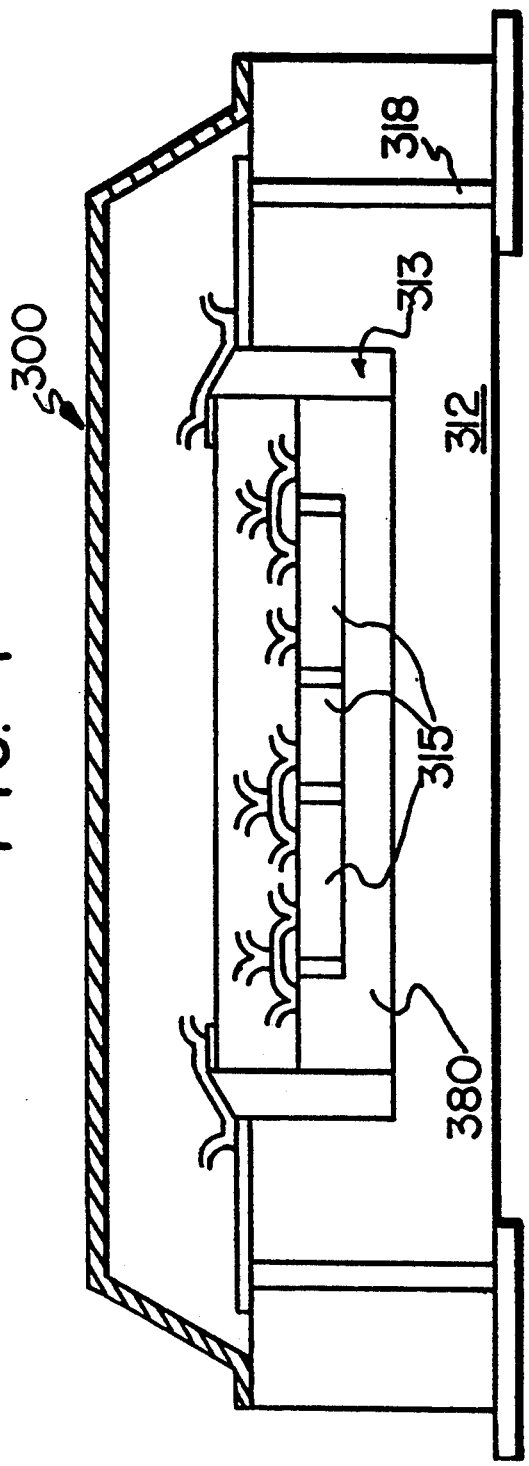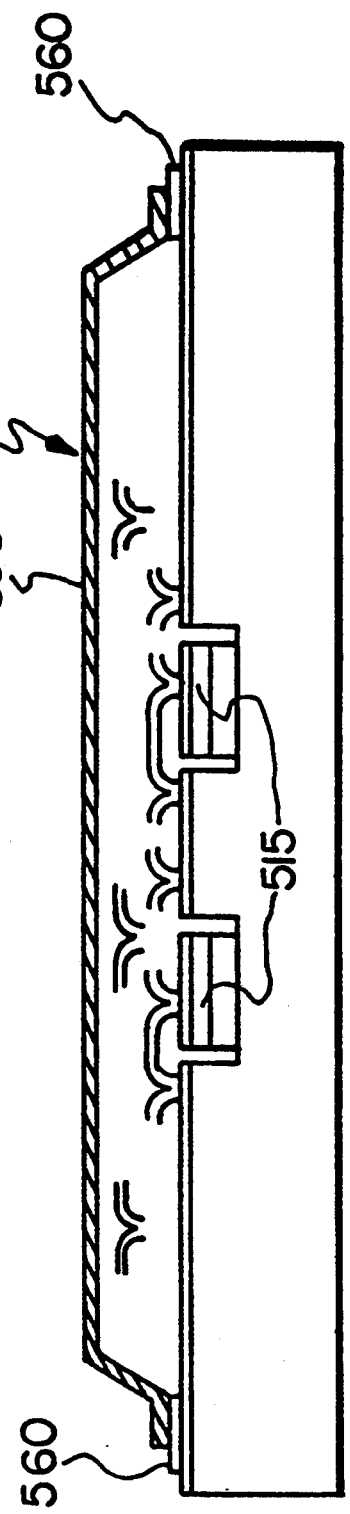

HERMETIC HIGH DENSITY INTERCONNECTED ELECTRONIC SYSTEM

This application is a continuation of application Ser. No. 07/454,546, filed Dec. 21, 1989 now abandoned.

RELATED APPLICATIONS

The present invention is related to application Ser. No. 454,545 Dec. 21, 1989 entitled "An Epoxy/Polyimide Copolymer Blend Dielectric and Layered Circuits Incorporating It" by R. J. Wojnarowski, et al, now abandoned in favor of divisional application Ser. No. 646,112, filed Jan. 28, 1991 now U.S. Pat. No. 5,108,825; and to application Ser. No. 454,547, filed Dec. 21, 1989 entitled "Enhanced Direct Bond Copper Process and Structure" by H. F. Webster, et al. now U.S. Pat. No. 4,996,116. Each of these applications and patent is incorporated herein by reference in its entirety.

BACKGROUND OF THE INVENTION

1. Field of the Invention

The present invention relates to the field of electronic circuit packaging, and more particularly, to the field of hermetically sealed electronic circuit packaging.

2. Background Information

Hermetically sealed packages have long been used to package semiconductor devices for use in high reliability systems and in hostile environments. A primary advantage of a hermetically sealed package for a sensitive electronic device or circuit is that the hermetic seal ensures that no outside contaminants or other deleterious materials can reach the sensitive device, component or circuit. This ensures that a device which, after hermetic sealing, meets specifications during testing will not deteriorate as a result of contamination or the introduction of other deleterious materials. This assurance is particularly important in systems which must exhibit a high reliability such as implanted medical electronic devices such as pacemakers, safety and emergency related electronic systems, electronic systems for use in space satellites where the system is inaccessible and horrendously expensive to replace and in other environments as may be considered desirable.

At one time, such high reliability systems, although complex for their time, were relatively small by today's standards and were fabricated from a relatively small number of electronic devices or integrated circuits, each of which was hermetically sealed in its own container. These hermetically sealed containers were then interconnected using printed circuit boards or other similar structures. When it was felt necessary to hermetically enclose the overall system, that assembled system was enclosed within a further hermetically sealed enclosure. Such large hermetic enclosures are expensive to fabricate and seal, encompass a substantial volume and have a substantial weight. The problem of weight is particularly severe with systems which have to meet military standard 883 for hermeticity because the preparation for the fine leak test requires the application of from 45 to 75 pound per square inch (psi) (3 to 5 atmospheres) of helium pressure to ensure that helium will infiltrate any unsealed areas. This pressure is sufficient to crush or collapse any can or lid having a significant surface area, if it is not strongly reinforced or of substantial thickness. Consequently, the strength and weight of hermetic cans increase disproportionately faster with increasing size in order to prevent them for being crushed during leak testing. This is a particular problem with circuit boards which are four inches square and larger.

One means of reducing the size and weight of such hermetically sealed systems was to mount packageless chips and integrated circuits on a circuit board and rely on the overall system hermetic enclosure to protect those chips. This resulted in some weight saving and some size saving in the overall hermetic enclosure.

Unfortunately, as electronic systems have continued to become more complex and require more chips for their fabrication, the penalties associated with hermetically enclosing a system in an overall hermetic can or enclosure have grown accordingly. It has also become important to make them more compact for a variety of reasons. Among these reasons are the need to fit electronic systems into relatively small spaces without adding substantial weight to the piece of equipment of which they form a part. Further, as mechanical systems have become more dependent on electronics for their implementation and control, more electronic systems tend to be incorporated within a given piece of equipment. Consequently, in order to keep the equipment compact, it has become important that the electronic equipment be packaged in as small and efficient a manner as possible.

While the production of a container for an electronic circuit which can be hermetically sealed does not seem, at first glance, to be a particularly complicated process, this initial perception can be misleading, especially when a new can configuration is required. Lead times for the fabrication of a new container configuration normally run at least 4–6 months and often run more. If changes are required the same period of time is needed for revisions. Consequently, when a new system is being designed, it must either be designed to fit into an existing hermetic enclosure or substantial lead time must be provided for the design and fabrication of the hermetic enclosure for that system.

The high density interconnect (HDI) structure or system which has been developed by General Electric Company offers many advantages in the compact assembly of electronic systems. For example, an electronic system such as a micro computer which incorporates 30–50 chips can be fully assembled and interconnected on a single substrate which is 2 inch long by 2 inch wide by 0.050 thick. Even more important, this interconnect structure can be disassembled for repair or replacement of a faulty component and then reassembled without significant risk to the good components incorporated within the system. This is particularly important where as many as 50 chips having a cost of as much as $2,000.00, each, may be incorporated in a single system on one substrate. This repairability is a substantial advance over prior connection systems in which reworking the system to replace damaged components was either impossible or involved substantial risk to the good components.

This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 4,835,704, entitled "Adaptive Lithography System to Provide High Density Interconnect" by C. W. Eichelberger, et al.; U.S. Pat. No. 4,714,516, entitled "Method to Produce Via Holes in Polymer Dielectrics for Multiple Electronic Circuit Chip Packaging" by C. W. Eichelberger, et al.;

U.S. Pat. No. 4,780,177, entitled "Excimer Laser Patterning of a Novel Resist" by R. J. Wojnarowski et al.; U.S. patent application Ser. No. 249,927, filed Sep. 27, 1989, entitled "Method and Apparatus for Removing Components Bonded to a Substrate" by R. J. Wojnarowski, et al.; U.S. patent application Ser. No. 310,149, filed Feb. 14, 1989, entitled "Laser Beam Scanning Method for Forming Via Holes in Polymer Materials" by C. W. Eichelberger, et al.; U.S. patent application Ser. No. 312,798, filed Feb. 21, 1989, entitled "High Density Interconnect Thermoplastic Die Attach Material and Solvent Die Attachment Processing" by R. J. Wojnarowski, et al.; U.S. patent application Ser. No. 283,095, filed Dec. 12, 1988, entitled "Simplified Method for Repair of High Density Interconnect Circuits" by C. W. Eichelberger, et al.; U.S. patent application Ser. No. 305,314, filed Feb. 3, 1989, entitled "Fabrication Process and Integrated Circuit Test Structure" by H. S. Cole, et al.; U.S. patent application Ser. No. 250,010, filed Sep. 27, 1988, entitled "High Density Interconnect With High Volumetric Efficiency" by C. W. Eichelberger, et al.; U.S. patent application Ser. No. 329,478, filed Mar. 28, 1989, entitled "Die Attachment Method for Use in High Density Interconnected Assemblies" by R. J. Wojnarowski, et al.; U.S. patent application Ser. No. 253,020, filed Oct. 4, 1988, entitled "Laser Interconnect Process" by H. S. Cole, et al.; U.S. patent application Ser. No. 230,654, filed Aug. 5, 1988, entitled "Method and Configuration for Testing Electronic Circuit and Integrated Circuit Chips Using a Removable Overlay Layer" by C. W. Eichelberger, et al.; U.S. patent application Ser. No. 233,965, filed Aug. 8, 1988, entitled "Direct Deposition of Metal Patterns for Use in Integrated Circuit Devices" by Y. S. Liu, et al.; U.S. patent application Ser. No. 237,638, filed Aug. 23, 1988, entitled "Method for Photopatterning Metallization Via UV Laser Ablation of the Activator" by Y. S. Liu, et al.; U.S. patent application Ser. No. 237,685, filed Aug. 25, 1988, entitled "Direct Writing of Refractory Metal Lines for Use in Integrated Circuit Devices" by Y. S. Liu, et al.; U.S. patent application Ser. No. 240,367, filed Aug. 30, 1988, entitled "Method and Apparatus for Packaging Integrated Circuit Chips Employing a Polymer Film Overlay Layer" by C. W. Eichelberger, et al.; U.S. patent application Ser. No. 342,153, filed Apr. 24, 1989, entitled "Method of Processing Siloxane-Polyimides for Electronic Packaging Applications" by H. S. Cole, et al.; U.S. patent application Ser. No. 289,944, filed Dec. 27, 1988, entitled "Selective Electrolytic Deposition on Conductive and Non-Conductive Substrates" by Y. S. Liu, et al.; U.S. patent application Ser. No. 312,536, filed Feb. 17, 1989, entitled "Method of Bonding a Thermoset Film to a Thermoplastic Material to Form a Bondable Laminate" by R. J. Wojnarowski; and U.S. patent application Ser. No. 363,646, filed Jun. 8, 1989, entitled "Integrated Circuit Packaging Configuration for Rapid Customized Design and Unique Test Capability" by C. W. Eichelberger, et al. Each of these patents and patent applications is incorporated herein by reference.

Briefly, in this high density interconnect structure, a ceramic substrate such as alumina which may be 100 mils thick and of appropriate size and strength for the overall system, is provided. This size is typically less than 2 inches square. Once the position of the various chips has been specified, individual cavities or one large cavity having appropriate depth at the intended locations of differing chips, is prepared. This is done by starting with a bare substrate having a uniform thickness and the desired size. Laser milling is then used to form the cavities in which the various chips and other components will be positioned. For many systems where it is desired to place chips edge-to-edge, a single large cavity is satisfactory. That large cavity may typically have a uniform depth where the semiconductor chips have a substantially uniform thickness. Where a particularly thick or a particularly thin component will be placed, the cavity bottom may be made respectively deeper or shallower to place the upper surface of the corresponding component in substantially the same plane as the upper surface of the rest of the components and the substrate surrounding the cavity. The bottom of the cavity is then provided with a thermoplastic adhesive layer which may preferably be polyetherimide resin available under the trade name ULTEM ® from the General Electric Company. The various components are then placed in their desired locations within the cavity, the entire structure is heated to the softening point of the ULTEM ® polyetherimide (in the vicinity of 217° C. to 235° C.) depending on the formulation used and then cooled to thermoplastically bond the individual components to the cavity. Thereafter, a polyimide film which may be Kapton ® polyimide, available from E. I. du Pont de Nemours Company, which is $\approx 0.0005$–0.003 inch ($\approx 12.5$–75 microns) thick is pretreated to promote adhesion and coated on one side with the ULTEM ® polyetherimide resin or other thermoplastic and laminated across the top of the chips, other components and the substrate with the ULTEM ® resin serving as a thermoplastic adhesive to hold the Kapton ® in place. Thereafter, via holes are laser drilled in the Kapton ® and ULTEM ® layers in alignment with contact pads on the electronic components to which it is desired to make contact. A metallization layer is deposited over the Kapton ® layer. This metallization extends into the via holes and makes electrical contact to contact pads disposed thereunder. This metallization layer may be patterned in the process of depositing it or may be deposited as a continuous layer and then patterned using photoresist and etching. The photoresist is preferably exposed using a laser to provide an accurately aligned conductor pattern at the end of the process.

Additional dielectric and metallization layers are provided as required in order to provide the desired interconnection pattern. Any misposition of the individual electronic components and their contact pads is compensated for by an adaptive laser lithography system which is the subject of some of the above-identified patents and applications.

In this manner, the entire interconnect structure can be fabricated from start to finish (after receipt of the electronic components) in as little as $\approx 8$–12 hours.

While this high density interconnect structure makes it feasible to fabricate and test complex electronic systems in much smaller packages than was previously achievable, where hermetic sealing of the package is required, the entire package must be separately enclosed in a hermetically sealed container. This substantially increases both the size and weight of the final electronic system.

It would therefore be desirable to provide a technique for hermetically enclosing a high density interconnect structure in a more efficient, more compact, lighter weight, shorter lead time manner.

This high density interconnect structure provides many advantages. Included among these are the fact that it results in the lightest weight and smallest volume packaging of such an electronic system presently available. A further, and possibly more significant advantage of this high density interconnect structure, is the short time required to design and fabricate a system using this high density interconnect structure. Prior art processes require the prepackaging of each semiconductor chip, the design of a multilayer circuit board to interconnect the various packaged chips, and so forth. Multilayer circuit boards are expensive and require substantial lead time for their fabrication. In contrast, the only thing which must be specially fabricated for the HDI system is the substrate on which the individual semiconductor chips will be mounted. This substrate is a standard stock item, other than the requirement that the substrate have appropriate cavities therein for the placement of the semiconductor chips so that the interconnect surface of the various chips and the substrate will be in a single plane. In the HDI process, the required cavities are provided in an already fired ceramic substrate by laser milling. This milling process is straightforward and fairly rapid with the result that once a desired configuration for the substrate has been established, a corresponding physical substrate can be made ready for the mounting of the semiconductor chips can be as short as 1 day and typically 4 hours for small quantities as are suitable for research or prototype systems to confirm the design prior to quantity production.

The process of designing an interconnection pattern for interconnecting all of the chips and components of an electronic system on a single high density interconnect substrate normally takes somewhere between one week and five weeks. Once that interconnect structure has been defined, assembly of the system on the substrate may begin. First, the chips are mounted on the substrate and the overlay structure is built-up on top of the chips and substrate, one layer at a time. Typically, the entire process can be finished in one day and in the event of a high priority rush, could be completed in four hours. Consequently, this high density interconnect structure not only results in a substantially lighter weight and more compact package for an electronic system, but enables a prototype of the system to be fabricated and tested in a much shorter time than required with other packaging techniques.

Accordingly, there is a need for a hermetic enclosure for a high density interconnect structures and other structures which exhibits the qualities of compactness, lightness and reliableness which will still withstand hermeticity test conditions and still be inexpensive and easy to fabricate.

OBJECTS OF THE INVENTION

Accordingly, a primary object of the present invention is to provide a means for hermetically sealing a high density interconnect structure.

Another object of the present invention is to hermetically seal a high density interconnect structure without significantly affecting its overall volume or weight.

A further object of the present invention is to provide a HDI package which is hermetic and which still enables the circuitry therein to operate at full speed without package induced limitations.

Still another object of the present invention is to provide an inexpensive, quick, low temperature process for forming and sealing a hermetic package.

Still another object of the present invention is to provide a low temperature process for hermetically sealing a conducting lead to the insulating body of a hermetic enclosure for an electronic component or system.

SUMMARY OF THE INVENTION

The above and other objects which will become apparent from the specification as a whole, including the drawings, are accomplished in accordance with one embodiment of the present invention by providing a hermetic metal covering disposed over non-hermetic portions of the exterior surface of a body to hermetically seal that body. Where the body to be sealed includes hermetic portions, the hermetic metal covering only needs to extend over non-hermetic portions of that exterior surface and over enough of the hermetic portion to form a hermetic seal with the hermetic portion of the exterior surface of the body. Thus, in a multilayer interconnect structure which includes a hermetic base, the hermetic metal covering can extend over the multilayer interconnect structure with the metal covering being supported by the multilayer interconnect structure and over enough of hermetic base to form a hermetic seal therewith. In this way, electrical leads may extend through the hermetic base without being shorted by the hermetic metal layer which is disposed over the non-hermetic portions of the multilayer interconnect structure.

This continuous metal covering may preferably be provided in a manner similar to that in which conducting layers within a high density interconnect structure are provided such as by sputtering a thin metallic adhesion promoting layer on top of the outermost layer of dielectric material in the multilayer structure and then preferably electroplating a thicker metal sealing layer on top of that adhesion promoting layer. It is preferred to provide this hermetic metal covering as two separately plated, but contiguous layers in order to prevent grain boundaries within the electroplated layer from extending all the way from the outermost dielectric layer to the outer surface of the electroplated layer, since such continuous grain boundaries can raise a concern that such grain boundaries could provide a slow leak failure mechanism for the hermetic seal. Preferably, if the electroplated metal sealing layer is susceptible to corrosion or other environmental attack, a passivating metal or dielectric layer is provided over the electroplated sealing layer to protect that layer from corrosion and other environment attack. This metal covering may be connected to conductors within the multilayer interconnect structure through vias in the outermost dielectric layer of the multilayer interconnect structure. The adhesion promoting layer may preferably be chromium or titanium, the metal sealing layer may preferably be chromium, chromium-nickel or copper. The passivating layer may preferably be chromium, titanium, nickel, lead, lead solder and so on when the sealing layer is copper.

Thus, this invention provides a low temperature hermetic sealing process.

Hermetic electrical feedthroughs are provided either by feedthroughs already present in the substrate or by the provision of feedthroughs disposed on the surface of the substrate which are themselves covered by an electrically insulating, thermal coefficient of expansion matching sealing layer to which the hermetic metal covering is hermetically sealed, either directly or via intermediate layers.

In accordance with an alternative embodiment of the invention, the continuous metal covering does not extend all the way to a hermetic seal with the substrate, but rather is spaced from the substrate by the outermost dielectric layer along the boundaries of the substrate. While such a structure is not rigorously hermetic, for a sufficiently thin dielectric layer having a sufficiently great length, it becomes essentially hermetic. A still smaller area continuous metal layer can serve as an electromagnetic shield for the circuits within the high density or other interconnect or printed circuit board structure.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 4 illustrates a modified configuration for a high density interconnect hermetic package in accordance with the present invention in which a fully tested high density interconnect or other structure is disposed in the cavity of a high density interconnect substrate and subsequently high density interconnected and hermetically sealed;

FIG. 6 illustrates an alternative pseudo-hermetic structure in accordance with the present invention;

DETAILED DESCRIPTION

Figure 1:
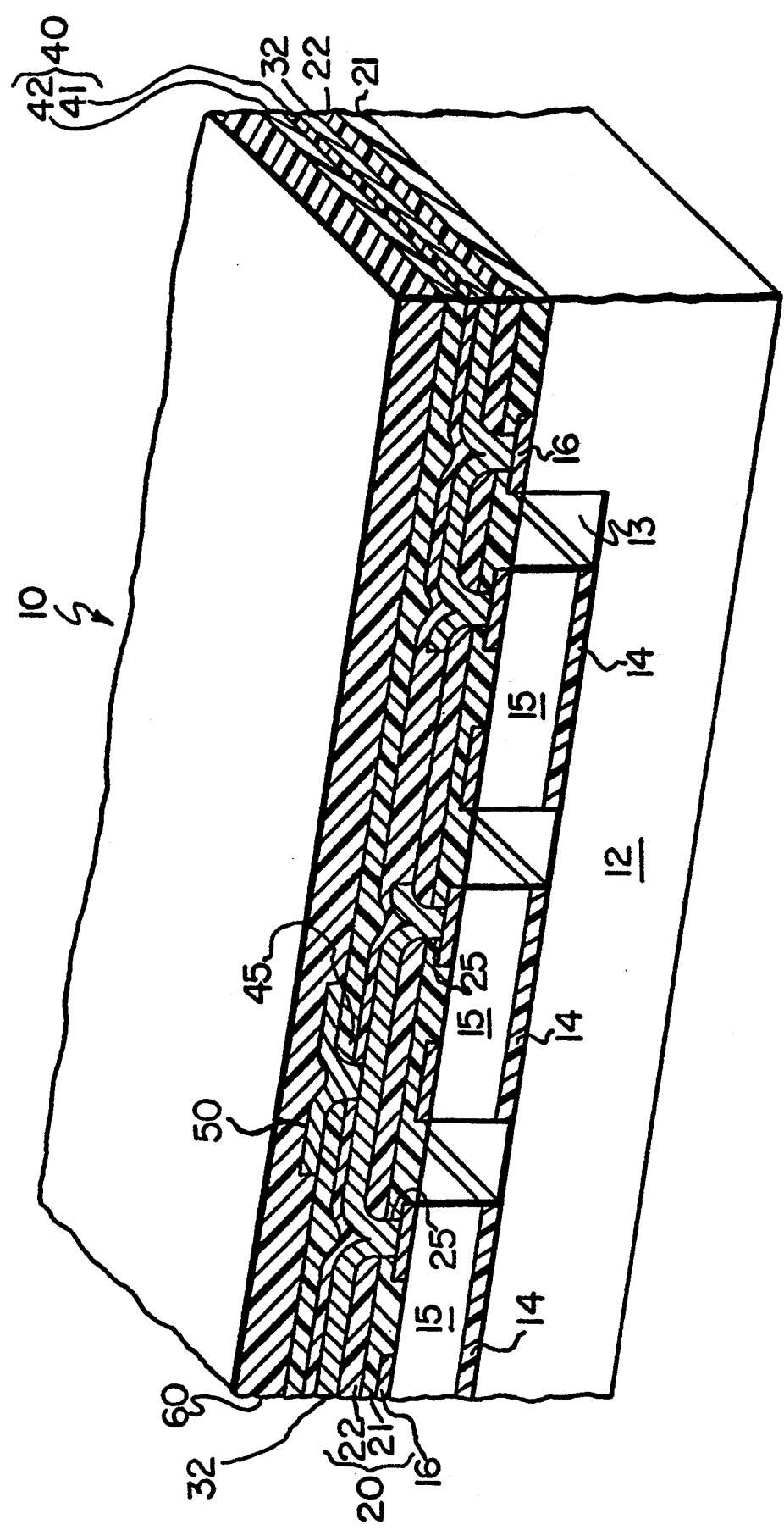
FIG. 1 illustrates, in a perspective cross-section view, a portion of a high density interconnect structure in accordance with the related patents.

In FIG. 1, a high density interconnect structure 10 in accordance to the patents referred to above, is illustrated in a cross-section, cut-away, perspective view. The high density interconnect structure 10 comprises a glass or ceramic substrate 12 which may preferably be alumina, which has a cavity 13 in which a plurality of integrated circuits 15 or other electronic components are mounted. The components 15 are secured in the cavity by a thermoplastic adhesive layer 14 which may preferably be polyetherimide resin available from the General Electric Company under the trademark ULTEM ®. Other thermoplastic adhesive layers may also be used. Each of the electronic components 15 has contact pads 16 disposed on the upper surface thereof, as does the substrate 12. A first dielectric layer 20 comprising a Kapton ® polyimide layer 22 is thermoplastically bonded to the upper surface of the electronic components 15 and the substrate 12 by a second, thermoplastic adhesive layer 21 of ULTEM ® resin. Via holes 25 are laser drilled in the dielectric layer 20 and a patterned metallization layer 30 comprising individual conductors 32 is disposed on the upper surface of the dielectric layer 20. A second dielectric layer 40 which may preferably comprise a lower or inner layer 41 of siloxane polyimide available under the trade name SPI-129 from Huls America of Phoenix, Ariz., and an outer dielectric layer 42 which may preferably be a copolymer blend of a polyimide and an epoxy in accordance with the related application Ser. No. 454,545. Via holes 45 may be drilled in that dielectric layer and in an additional metallization layer 50 disposed on the dielectric layer 40. A dielectric layer 60 of an epoxy polyimide copolymer blend is disposed over the metallization layer 50. Additional metallization and dielectric layers may be provided as is required for the interconnection of the circuit.

Figure 2:
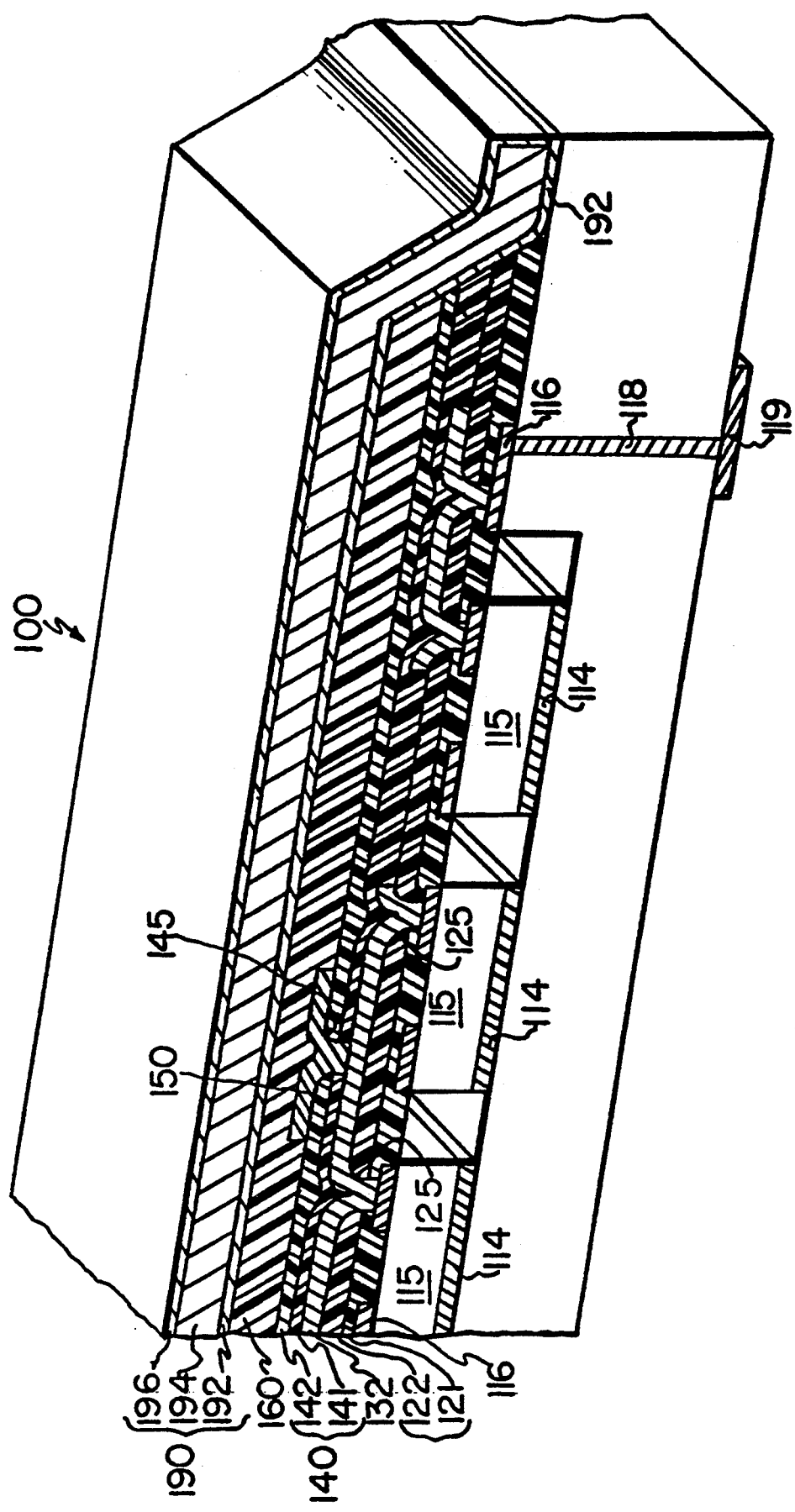
FIG. 2 illustrates a hermetic high density interconnect structure in accordance with the present invention in which hermetic feedthroughs are provided in the high density interconnect substrate.

In accordance with the present invention, a hermetically sealed high density interconnect structure 100 may be formed by providing hermetic feedthroughs 118 in the substrate 112 as illustrated in FIG. 2 and by the providing a hermetic metal layer 190 disposed on the upper surface of the outermost dielectric (electrically insulating) layer 160 of the high density interconnect structure. As illustrated in FIG. 2, this hermetic metal layer 190 extends down onto the upper surface of the substrate 112 where it forms a hermetic seal with the substrate. The layer 190 preferably comprises a thin 1000 Å to 3000 Å A thick adhesion promoting layer 192 which may preferably be chromium or titanium. This adhesion promoting layer is preferably sputtered on the upper surface of the dielectric layer 160 and the substrate 112. Where the adhesion promoting layer is chromium or titanium, a thin copper layer may be sputtered over it prior to opening the sputtering chamber in order to prevent oxidation of that layer upon exposure of the structure to air. A thicker, preferably electroplated metal sealing layer 194 is disposed on the adhesion promoting layer 192. The metal sealing layer may preferably be chromium, chromium-nickel, nickel or copper and so forth. This thick metal sealing layer is included in order to provide increased metal thickness and assurance of hermeticity. While a thick sputtered layer could be used to provide this thickness, that is not preferred because sputtered layers are hard rather than ductile and because of the relatively slow rate at which a sputtered layer builds up. The adhesion promoting layer may be disposed directly on the upper surface of the substrate 112 or the substrate 112 may have a metallization layer formed on the upper surface of the substrate prior to the beginning of the fabrication of the multilayer interconnect structure. That preformed metallization layer may preferably be direct bond copper which has been direct bonded to that surface in accordance with the above-identified related U.S. Pat. No. 4,996,116.

At the same time as such a metal layer is provided around the periphery of the upper surface of the substrate 112, individual conductive leads 119 may be provided on the lower surface of the substrate 112 in electrical contact with the hermetically sealed feedthrough conductors 118. The feedthrough conductors 118 may be formed in a manner which is well known in the ceramic package and glass to metal seal arts.

The metal sealing layer 194 is preferably formed in two separate electroplating steps in order to prevent grain boundaries from extending directly from the adhesion promoting layer 192 to the upper surface of the electroplated metal sealing layer. Merely removing the part from the electroplating bath and then reinserting it into the bath appears to be sufficient to break up these grain boundaries. If further assurance of the break up of the grain boundaries is desired, an additional adhesion-promoting-like layer may be sputtered on the initial portion of the electroplated layer and the second portion of the electroplated layer thereover. Once the entire electroplated layer has been formed, it is preferred to form an environmental protection layer 196 thereover, if the sealing layer 194 is copper or some other environmentally vulnerable metal which is subject to corrosion, solublization or other environmental attack which creates a risk of the creation of pinholes or larger holes in the sealing layer with a resulting failure of the desired hermetic seal. Where the sealing layer is copper, both the grain boundary concern and the environmental protection concern can be solved by plating the copper surface with solder and then reflowing that solder in hot gas. Solder reflow in hot gas is a well-known technique in the electronic packaging arts. Upon reflowing, the solder will provide a continuous passivating layer on the outer surface of the metal sealing layer and at the same time seal all of the grain boundaries in the sealing layer itself.

It is preferred that the layer 190 have a thickness in the range from 1 to 5 mils, although either thinner or thicker layers may be employed. It is considered important that the layer 190 be ductile in order that the difference in thermal coefficient of expansion between the layer 190 and the various dielectric layers 120, 140 and 160 will not result in metal fatigue fractures of the layer 190 in the vicinity of the transition region where the layer 190 changes from being disposed on the substrate upper surface to being disposed on the dielectric layers.

As an alternative to sputtering an adhesion promoting layer on the outermost dielectric layer, a palladium electroless plating seeding layer may be formed on that surface in any of the vast number of known ways of depositing such palladium layers. These include dipping the body in a palladium seed bath, using organometallic palladium compounds which are thermally or optically decomposed to deposit the palladium and so forth.

Where the electroplated sealing layer is nickel, the electroplating may preferably be done using a Watts bath.

In order to provide a hermetically sealed enclosure, the hermetic metallization layer 190 must be disposed in contact with the upper surface of the substrate 112 or a metallization layer disposed thereon for a sufficient width to ensure a hermetic bond between the two portions of the structure. The required width will depend on the particular materials employed and their mutual adherence. Using the enhanced direct bond copper process of related U.S. Pat. No. 4,996,116, a distance of less than 100 mils is sufficient.

Figure 3:
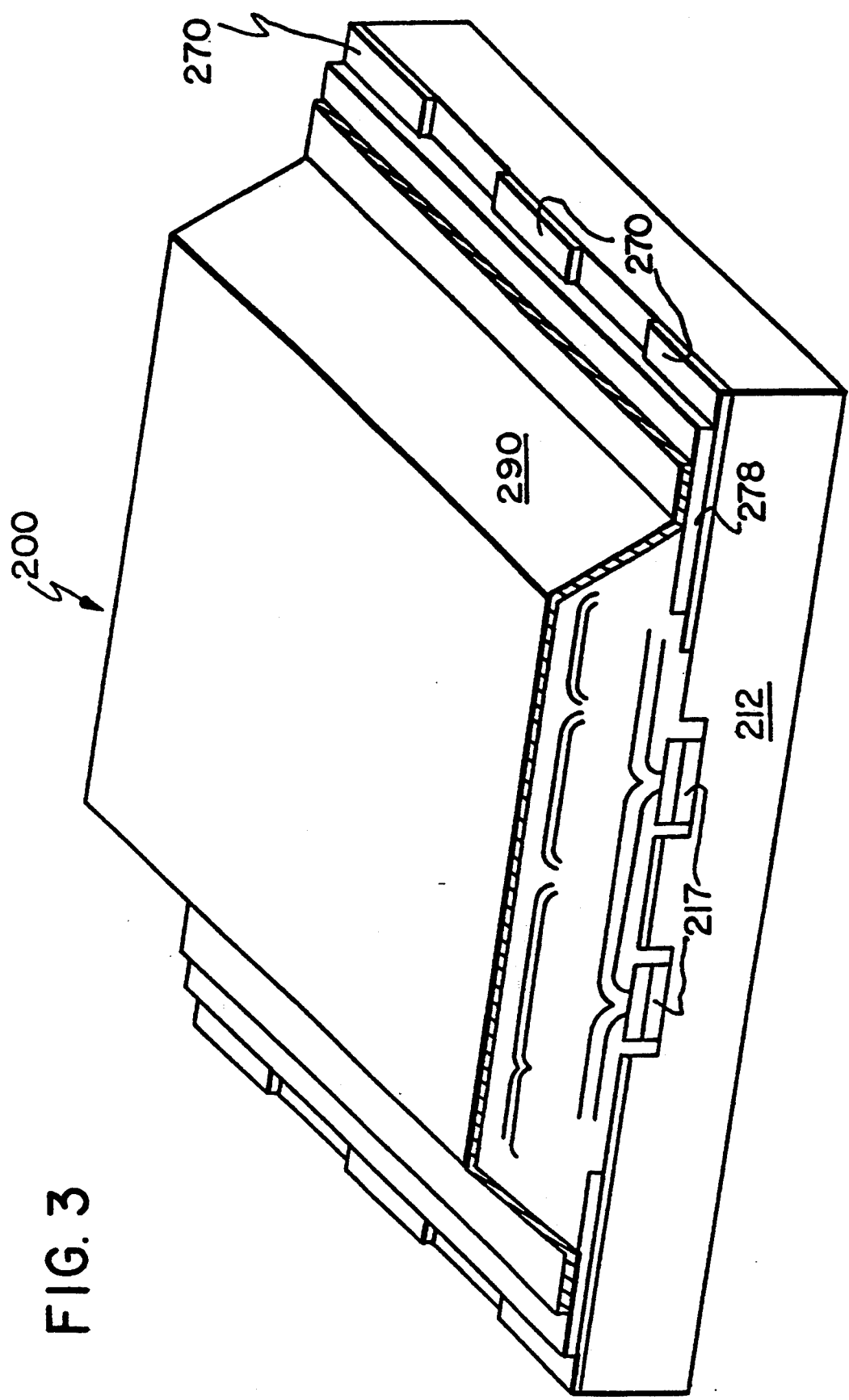
FIG. 3 illustrates a hermetic high density interconnect structure in accordance with the present invention in which hermetic feedthrough leads are provided along the upper surface of the high density interconnect substrate.

An alternative configuration 200 of a hermetic HDI structure in accordance with the present invention is illustrated in cross-section in FIG. 3. This structure differs from the FIG. 2 structure in the presence of metallic heat spreaders 217 under the integrated circuit chips and in the manner in which the hermetic electrical feedthroughs are provided. In this case, the feedthroughs are provided as separate metal conductors 270 disposed on the upper surface of the substrate 212. Metal conductors 270 may preferably be direct bond copper where the substrate is alumina or beryllia. A glass, or other dielectric sealing layer 278 is disposed over these feedthrough conductors and has a sufficient length in the X-direction in the figure to ensure that a hermetic seal is provided between this dielectric sealing 278 layer and both the metal feedthroughs 270 and the exposed surface of the substrate 212. The multilayer interconnect structure is set back from the edge of dielectric sealing layer 278 and the hermetic metal covering layer 290 extends onto this glass layer for a sufficient distance to form a hermetic seal. The formation of this hermetic seal may be facilitated by providing a metallization layer on the upper surface of the dielectric sealing layer as part of the process of preparing the substrate prior to the mounting of electronic components in the cavities of the substrate and prior to the beginning of the fabrication of the multilayer interconnect structure.

In FIG. 4, a modified version 300 of the structure 100 of FIG. 2 is illustrated. In the structure 300, rather than the individual integrated circuit chips 315 being disposed directly in the substrate 312, these integrated circuit chips are instead disposed on a separate carrier 380 and are interconnected into a complete system on that carrier in the manner of the high density interconnect structure which has been described above or in such other manner as may be appropriate. After this carrier-based structure is electrically tested and found to meet specifications, it is bonded into the cavity 313 in the substrate 312. Thereafter, a multilayer high density interconnect structure is disposed over the structure of the carrier 380 and the substrate 312 to provide electrical connection between conductors on the carrier 380 and the conductors on the substrate 312 in order to provide connections between the hermetic feedthrough leads 318 and the devices on the carrier 380. Thereafter, the hermetic metal layer is disposed over the multilayer high density interconnect structure of the substrate 312 in a manner similar to that described above in order to provide a hermetic seal over the entire structure.

The process of providing hermetic feedthrough leads either in the substrate as illustrated in FIGS. 2 and 4, or on the upper surface of the substrate as illustrated in FIG. 3, significantly complicates the process of initially fabricating the substrate.

Figure 5:
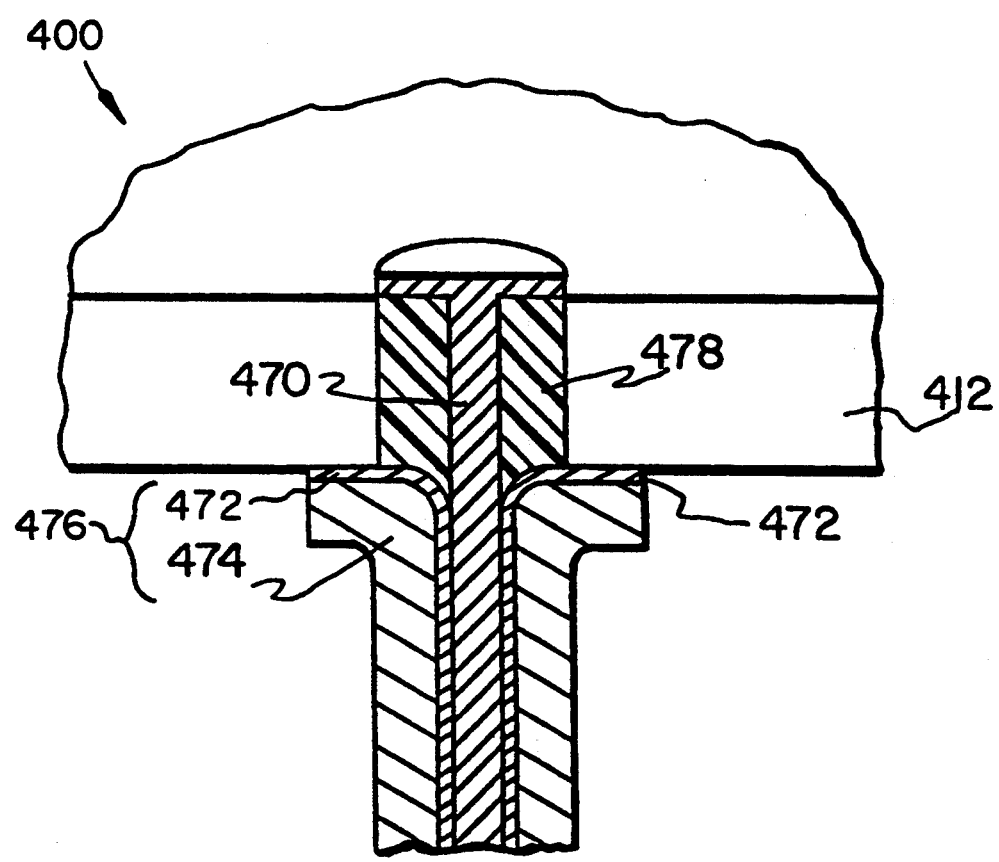
FIG. 5 illustrates an alternative hermetic feedthrough configuration in accordance with the invention.

An alternative hermetic lead configuration is illustrated in FIG. 5 where a single feedthrough lead 470 is shown. The lead 470 extends through an aperture in a substrate 412. The gap between the wall of the aperture and the lead 470 is filled with a dielectric or metallic material 478 which may be a polyetherimide, a polyimide, a siloxane-polyimide or any other suitable material. Alternatively, the lead may be a press fit or even swaged in the aperture. In that case, a small quantity of a pliable polymer is placed around the lead to provide the flexibility needed to prevent metal fatigue from fracturing the hermetic seal. In this structure, use of a metallic sealing layer 474 is feasible because the insulating substrate separates the various leads from each other and from the hermetic metal layer 490 (not shown) which will hermetically seal this complete structure. A hermetic seal is provided by a "flange" 476 of electroplated metal which is disposed in hermetic contact with the substrate 412 and the lead 470. This flange may be formed by sputtering an adhesion promoting layer 472 on the substrate, sealing layer 478, and lead 470 and then patterning that adhesion promoting layer to provide electrically separate segments around each hermetic lead 470. Alternatively, the sputtering can be done in a patterned manner using a mask. The thick portion 474 of the sealing flange is then electroplated on the individual segments 472 of the adhesion promoting layer by connecting all of the leads 470 together in an appropriate manner. This provides a low temperature process for creating hermetically sealed leads in a ceramic or other insulating substrate.

There are a number of situations in which true hermeticity is not required while better sealing than is provided by the HDI multilayer structure alone is required. A pseudo-hermetic package 500 in accordance with the present invention is illustrated in cross-section in FIG. 6. This structure is much like the structure of FIG. 3 except that the glass layer over the surface feedthrough leads is omitted and electrical insulation is provided for those leads with respect to the continuous metal covering layer 590 by the outermost dielectric layer 560 of the multilayer high density interconnect structure. This layer is preferably rather thin and extends for a significant distance along the surface feedthrough leads. The continuous metal covering layer 590 then extends along most of the length of this thin dielectric layer extension. By restricting the covering layer from extending all the way to the substrate and feedthrough conductors, electrical insulation of the various feedthrough conductors is maintained. At the same time, the thinness of the outer dielectric layer 560 (approximately 0.3-5 mils, 7.5-125 microns thick) in combination with its width beyond the bulk of the multilayer structure serve to provide a thin, long path which any contaminant must follow in order to reach one of the sensitive electronic components 515. This path is made long enough that the diffusion of the contaminant will require a great deal of time, even in the situation where the contaminant is present in high concentration outside the pseudo-hermetic enclosure. This structure is substantially less complex and less expensive to fabricate than the structures of FIGS. 2-4. Thus, it may be considered preferable for those situations where true hermeticity is not required.

The continuous metal covering layer 590 provides electrical advantages in addition to the environmental or chemical advantages of providing hermeticity. In particular, it provides electrical shielding for both the electronic components 515 and the conductors of the multilayer interconnect structure which interconnect those components. In some situations, the electrical shielding is more important than the environment shielding with the result that the continuous metal layer does not need to extend as far as has been shown in the Figures. In particular, electrical shielding is provided by having the continuous metal layer extend to and across each of the electronic components which is to be shielded thereby. Consequently, the continuous metal layer may be made substantially smaller than has been shown in the figures for those situations where only electrical shielding is required. Where only shielding is required, the metal layer may have a grid-like configuration with the size of the openings in the grid being determined by the degree of shielding required and the frequencies at which shielding is required.

As a further variation on the hermetic package which has been described, the hermetic metal covering layer, rather than being electrically insulated from the conductors of the multilayer interconnect structure, may intentionally be connected to selected ones of the conductors within the multilayer interconnect structure. This may be done by drilling via holes in the outermost dielectric layer of the multilayer interconnect structure at those locations where electrical contact between the covering layer 190 and conductors within the multilayer interconnect structure is desired. Once this has been done, the covering layer may be deposited and will extend into the via holes because of the conformal nature of the sputtered adhesion promoting layer. Although the presence of the titanium layer is preferred, it will be understood by those skilled in the art that other adhesion promoting layers may be employed instead or the adhesion promoting layer may be omitted entirely. By interconnecting the hermetic metal covering layer and conductors within the multilayer interconnect structure, the covering layer may serve as a high conductivity ground plane in accordance with the connections between the covering layer and layers within the multilayer interconnect structure. Where the via holes in the outermost dielectric layer are large enough that the covering layer 190 will not fill those via holes, it may be considered desirable to deposit a relatively thin conducting layer in the via holes and on the outer surface of the conducting layer 160 in the vicinity of the via holes and then fill the remainder of the via hole with dielectric material in order to provide a substantially planar outer surface on which the hermetic metal layer 190 is deposited. If that is done, the hermetic metal layer makes contact to the conducting material disposed in the via hole in the area around the via hole where that conducting material is disposed on top of the outermost dielectric layer.

While the hermetic metal covering layer has been described as being electroplated chromium, nickel or copper, it will be understood that other metals and other application techniques may be used as desired. While it would be possible to form and position a previously formed metal foil on top of the multilayer interconnect structure, that procedure is not preferred because of the difficulties in ensuring that no gas is trapped inside that "cover". Such a "cover" could be secured to the substrate by soldering to metallization disposed thereon. Alternatively, the cover and or the substrate seal area could be lead plated and solder reflow used to form the seal. This should ensure that a hermetic seal is formed between that "cover" and the substrate.

While several forms of electrical feedthrough have been illustrated, it will be understood that other feedthrough techniques may be employed. These include variations on the copper ball technique which is disclosed in U.S. patent application Ser. No. 367,525, filed Jun. 16, 1989, entitled "Hermetic Package Having a Lead Extending Through an Aperture in the Package Lid and Package Semiconductor Chip" by D. L. Watrous, et al.; U.S. patent application Ser. No. 375,636, filed Jul. 3, 1989, entitled "Hermetic Package and Packaged Semiconductor Chip Having Closely Spaced Leads Extending Through the Package Lid" by V. A. K. Temple, et al.; U.S. patent application Ser. No. 375,641, filed Jul. 3, 1989, entitled "High Current Hermetic Package Including an Internal Foil and Having a Lead Extending Through the Package Lid and a Packaged Semiconductor Chip" by C. A. Neugebauer, et al.

Each of the package configurations in accordance with the invention illustrated thus far has a solid structure which is extremely rugged and durable since it contains no air space into which a hermetic cover can be collapsed. However, the use of this invention is not so limited.

Figure 7:
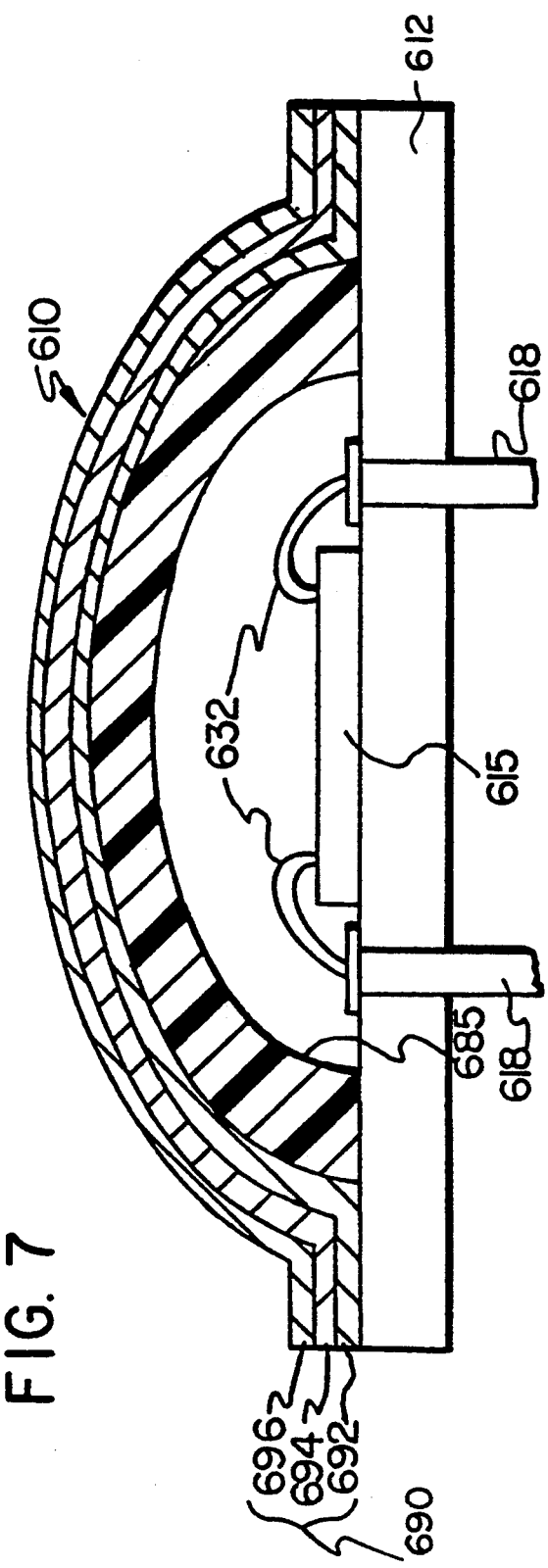
FIG. 7 illustrates a hermetically sealed hollow body in accordance with the present invention.

In FIG. 7 an embodiment 610 which is applicable to wire bonded chips is illustrated in a cross-section view. In structure 610, the substrate 612 has a plurality of hermetic feed through leads which may have been presecured or which are sealed in accordance with the FIG. 5 technique extending therethrough. A bare semiconductor chip is bonded to the upper surface of the substrate 612 and connected to the hermetic leads 618 by a plurality of wire bonds 632 which stand up above the substrate and which would short out if crushed flat. A dielectric or metallic dome is positioned over the chips 615, the wire bonds 632 and the substrate 612 and bonded to the substrate by an appropriate adhesive. A sealing layer of metal 690 is then formed thereover in the manner which has been discussed. As illustrated, the layer 690 comprises a adhesion promoting layer 692, a sealing layer 694 and a protection layer 696.

Figure 8:
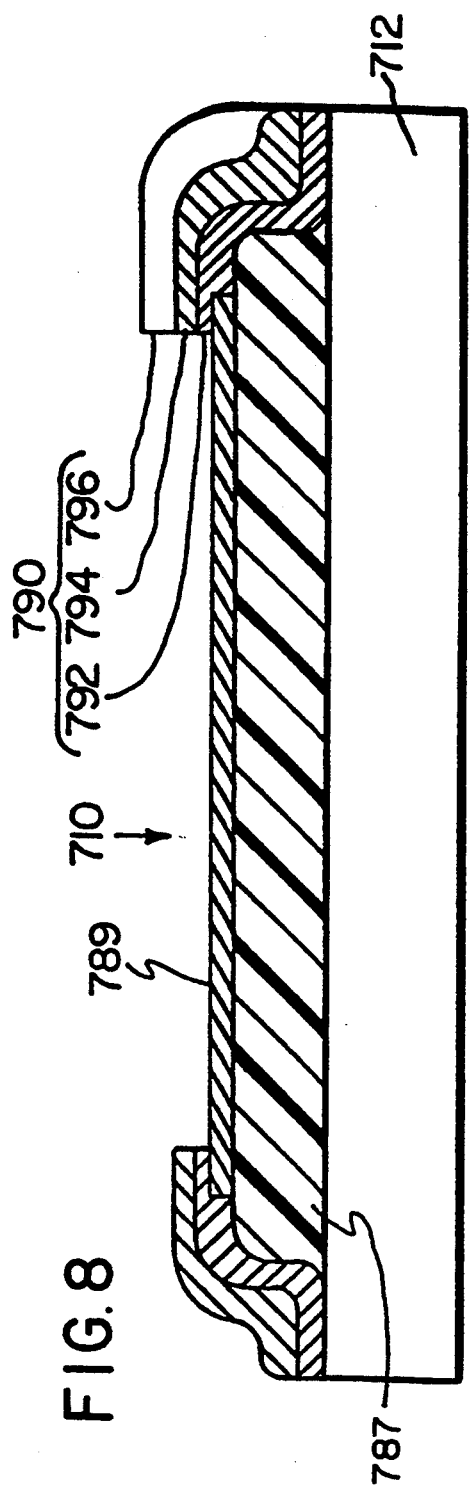
FIG. 8 illustrates an alternative hermetically sealed body in accordance with the invention.

In FIG. 8 a structure 710 in accordance with an alternative embodiment is illustrated. The body 710 has a hermetic substrate 712 and a structure thereon which is not hermetic which is indicated by reference numeral 787. This non-hermetic structure can be solid as shown or can be hollow. In either case, a metal plate 789 can be disposed over the structure 787 and secured thereto by adhesive or other means. This reduces the size of the non-hermetic portion of the surface of the body 710 to that of the side walls of the structure 787. A hermetic metal layer 790 is formed on this side wall area in the manner which has been described. This hermetic layer may be restricted to the vicinity of the side wall area by masking to yield the structure shown in FIG. 8 or the hermetic layer may be allowed to plate on top of the metal plate 789 in addition by not masking that plate during the electroplating.

Many variations on these structures may be used. Further, this technique is useful for hermetically sealing anything which has a continuous surface and is not harmed by having a conductive layer disposed on the portion of its surface which needs to be sealed. Thus, the hermetic sealing process of this invention is applicable to solid bodies, hollow bodies and porous bodies so long as the porous bodies have sufficiently small pores that the plated sealing layer will bridge all gaps in the surface to seal them.

This invention is particularly useful with HDI structures, ceramic printed circuit boards and other electronic structure which inherently have or can be easily modified to have a hermetic, dielectric portion separate from the hermetic covering layer through which electrical leads can pass and be hermetically sealed without being shorted by the hermetic metal layer.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

We claim:

1. An electronic system comprising:
    a substrate having a plurality of electronic components disposed thereon;
    a multilayer interconnect structure comprising interleaved layers of dielectric material and conductive material disposed over said substrate and said electronic components;
    a continuous metal layer comprising a thin adhesion promoting sub-layer disposed on said multilayer interconnect structure and a thicker electroplated metal sealing sub-layer disposed on said adhesion promoting sub-layer;
    said multilayer interconnect structure being set back from the edges of said substrate; and
    said continuous metal layer extending beyond said multilayer interconnect structure on all sides thereof.

2. The electronic system recited in claim 1 wherein:
    said substrate is impervious to liquids and gases; and
    said continuous metal layer is hermetically sealed to said substrate whereby said electronic components and said multilayer interconnect structure are hermetically sealed within a hermetic enclosure formed by said substrate and said continuous metal layer.

3. The system recited in claim 2 wherein:
    said continuous metal layer is disposed in contact with said substrate on all sides of said multilayer interconnect structure.

4. The system recited in claim 3 wherein:
    said substrate includes hermetically sealed electrical feedthroughs for conducting electrical signals between the interior of said hermetically sealed enclosure and the region outside of said enclosure.

5. The system recited in claim 2 wherein:
    said system includes a plurality of feedthrough electrical leads, each extending from within said hermetic enclosure to outside of it;
    at least one of said feedthrough leads is disposed on the upper surface of said substrate;
    an electrically insulating sealing material overlies and hermetically seals said at least one feedthrough lead; and
    said continuous metal layer is disposed over said electrically insulating sealing material and hermetically sealed to it.

6. The system recited in claim 2 wherein:
    said substrate includes a sealing conductor disposed on the surface thereof, said sealing conductor encircling said multilayer interconnect structure;
    said multilayer interconnect structure is set back from at least part of said sealing conductor; and
    said continuous metal layer is disposed in contact with said sealing conductor.

7. An electronic system comprising:
    a substrate having a plurality of electronic components disposed thereon, said components having contact pads on major surfaces thereof;
    a multilayer interconnect structure comprising interleaved layers of dielectric material and conductive material disposed over said substrate and said electronic components, said layers of dielectric material including a first layer of dielectric material bonded to said major surfaces of said components, said first layer of dielectric material including via holes therein in alignment with said contact pads, and said layers of conductive material including a pattern of interconnection conductors disposed on said first layer of dielectric material so as to extend into and between at least some of said via holes to provide electrical connection between at least some of said contact pads; and
    a continuous metal layer comprising a thin adhesion promoting sub-layer disposed on said multilayer interconnect structure and a thicker electroplated metal sealing sub-layer disposed on said adhesion promoting sub-layer, said continuous metal layer including one or more metals selected from the group consisting of chromium, copper, nickel and titanium.

8. The electronic system recited in claim 7 wherein: said continuous metal layer extends into alignment with each of said electronic components.

9. The electronic system recited in claim 8 wherein: said continuous metal layer extends across each of said electronic components.

10. The system recited in claim 9 wherein: said continuous metal layer extends across substantially the entire outer surface of said multilayer interconnect structure.

11. An electronic system comprising:
a substrate having a plurality of electronic components disposed thereon, said components having contact pads on major surfaces thereof;
a multilayer interconnect structure comprising interleaved layers of dielectric material and conductive material disposed over said substrate and said electronic components, said layers of dielectric material including a first layer of dielectric material bonded to said major surfaces of said components, said first layer of dielectric material including via holes therein in alignment with said contact pads, and said layers of conductive material including a pattern of interconnection conductors disposed on said first layer of dielectric material so as to extend into and between at least some of said via holes to provide electrical connection between at least some of said contact pads; and
a continuous metal layer disposed on said multilayer interconnect structure in electrical contact with a portion of a conductive material layer of said multilayer interconnect structure.

12. An electronic system comprising:
a substrate having a plurality of electronic components disposed thereon;
a multilayer interconnect structure comprising interleaved layers of dielectric material and conductive material disposed over said substrate and said electronic components;
a continuous metal layer disposed on said multilayer interconnect structure;
said multilayer interconnect structure including an outermost dielectric layer;
said outermost dielectric layer having at least one via extending therethrough in alignment with a portion of a conductive material layer of said multilayer interconnect structure; and
said continuous metal layer extending into said via and into electrical contact with said portion of said conductive material layer which is disposed in alignment with said via.

13. The electronic system recited in claim 12 wherein: said multilayer interconnect structure is set back from the edges of said substrate;
said continuous metal layer extends beyond said multilayer interconnect structure on all sides thereof.

14. The electronic system recited in claim 13 wherein: said substrate is impervious to liquids and gases; and said continuous metal layer is hermetically sealed to said substrate whereby said electronic components and said multilayer interconnect structure are hermetically sealed within a hermetic enclosure formed by said substrate and said continuous metal layer.

15. The system recited in claim 14 wherein: said continuous metal layer is disposed in contact with said substrate on all sides of said multilayer interconnect structure.

16. The system recited in claim 14 wherein: said system includes a plurality of feedthrough electrical leads, each extending from within said hermetic enclosure to outside of it;
at least one of said feedthrough leads is disposed on the upper surface of said substrate;
an electrically insulating sealing material over lies and hermetically seals said at least one feedthrough lead; said continuous metal layer is disposed over said electrically insulating sealing material and hermetically sealed to it.

17. The system recited in claim 15 wherein: said substrate includes hermetically sealed electrical feedthroughs for conducting electrical signals between the interior of said hermetically sealed enclosure and the region outside of said enclosure.

18. An electronic system comprising:
a substrate having a plurality of electronic components disposed thereon;
a multilayer interconnect structure comprising interleaved layers of dielectric material and conductive material disposed over said substrate and said electronic components;
a continuous metal layer disposed on said multilayer interconnect structure;
said multilayer interconnect structure being set back from an edge of said substrate and including an outermost dielectric layer;
said outermost dielectric layer having at least one via extending therethrough in alignment with a portion of a conductive material layer of said multilayer interconnect structure;
a conductive material disposed over said outermost dielectric layer in the vicinity of said via and extending into said via and into electrical contact with said portion of a conductive material layer which is disposed in alignment with said via; and
a dielectric material disposed in said via over said conductive material whereby said dielectric material, the part of said conductive material disposed on said outermost dielectric layer outside said via and said outermost dielectric layer in the vicinity of said conductive material together form a substantially planar surface on which said continuous metal layer is disposed, said continuous metal layer extending beyond said multilayer interconnect structure on all sides thereof and being disposed in electrical contact with said conductive material in the vicinity of said via.

19. The electronic system recited in claim 18 wherein: said substrate is impervious to liquids and gases; and said continuous metal layer is hermetically sealed to said substrate whereby said electronic components and said multilayer interconnect structure are hermetically sealed within a hermetic enclosure formed by said substrate and said continuous metal layer.

20. The system recited in claim 19 wherein: said continuous metal layer is disposed in contact with said substrate on all sides of said multilayer interconnect structure.

21. The system recited in claim 20 wherein:

said substrate includes hermetically sealed electrical feedthroughs for conducting electrical signals between the interior of said hermetically sealed enclosure and the region outside of said enclosure.

22. The system recited in claim 19 wherein:

said system includes a plurality of feedthrough electrical leads, each extending from within said hermetic enclosure to outside of it;

at least one of said feedthrough leads is disposed on the upper surface of said substrate;

an electrically insulating sealing material over lies and hermetically seals said at least one feedthrough lead;

said continuous metal layer is disposed over said electrically insulating sealing material and hermetically sealed to it.

23. An electronic system comprising:

a substrate having a plurality of electronic components disposed thereon, said components having contact pads on major surfaces thereof;

a multilayer interconnect structure comprising interleaved layers of dielectric material and conductive material disposed over said substrate and said electronic components, said layers of dielectric material including a first layer of dielectric material bonded to said major surfaces of said components, said first layer of dielectric material including via holes therein in alignment with said contact pads, and said layers of conductive material including a pattern of interconnection conductors disposed on said first layer of dielectric material so as to extend into and between at least some of said via holes to provide electrical connection between at least some of said contact pads; and a continuous metal covering comprising a thin adhesion promoting sub-layer disposed on the outermost surface of said multilayer interconnect structure and a thicker electroplated metal sealing sub-layer disposed on said adhesion promoting sub-layer.

24. The electronic system recited in claim 23 wherein:

said continuous metal covering extends into alignment with and across each of said electronic components.

25. The system recited in claim 24 wherein:

said continuous metal covering extends across substantially the entire outer surface of said multilayer interconnect structure.

26. An electronic system comprising:

a substrate having a plurality of electronic component disposed thereon;

a multilayer interconnect structure comprising interleaved layers of dielectric material and conductive material disposed over said substrate and said electronic components;

a continuous metal covering comprising a thin adhesion promoting sub-layer disposed on the outermost surface of said multilayer interconnect structure and a thicker electroplated metal sealing sub-layer disposed on said adhesion promoting sub-layer;

said multilayer interconnect structure being set back from the edges of said substrate; and said continuous metal covering extending beyond said multilayer interconnect structure on all sides thereof.

27. The electronic system recited in claim 26 wherein:

said substrate is impervious to liquids and gases; and said continuous metal covering is hermetically sealed to said substrate whereby said electronic components and said multilayer interconnect structure are hermetically sealed within a hermetic enclosure formed by said substrate and said continuous metal covering.

28. The system recited in claim 27 wherein:

said continuous metal covering is disposed in contact with said substrate on all sides of said multilayer interconnect structure.

29. The system recited in claim 28 wherein:

said substrate includes hermetically sealed electrical feedthroughs for conducting electrical signals between the interior of said hermetically sealed enclosure and the region outside of said enclosure.

30. The system recited in claim 27 wherein:

said system includes a plurality of feedthrough electrical leads, each extending from within said hermetic enclosure to the outside of it;

at least one of said feedthrough leads is disposed on the upper surface of said substrate;

an electrically insulating sealing material over lies and hermetically seals said at least one feedthrough lead;

said continuous metal layer is disposed over said electrically insulating sealing material and hermetically sealed thereto.

31. In an electronic system with a structure of the type including a substrate having a plurality of electronic components disposed thereon, a multilayer interconnect structure including a layer of dielectric material laminated over said substrate and said electronic components, said dielectric layer having a plurality of vias therein, a patterned layer of conductive material disposed over said dielectric layer and extending into said vias and into electrical contact with contact pads disposed on said electronic components and a second layer of dielectric material disposed over said patterned layer of conductive material, the improvement comprising:

said multilayer interconnect structure being set back from the edges of said substrate;

a continuous metal covering comprising a thin adhesion promoting sub-layer disposed on said multilayer interconnect structure and a thicker electroplated metal sealing sub-layer disposed on said adhesion promoting sub-layer, said continuous metal covering extending into alignment with and across each of said electrical components, and extending beyond said multilayer interconnect structure on all sides thereof.

32. The electronic system recited in claim 31 wherein:

said substrate is impervious to liquids and gases; and said continuous metal covering is hermetically sealed to said substrate whereby said electronic components and said multilayer interconnect structure are hermetically sealed within a hermetic enclosure formed by said substrate and said continuous metal covering.

33. The system recited in claim 32 wherein:

said continuous metal covering is disposed in contact with said substrate on all sides of said multilayer interconnect structure.

34. The system recited in claim 33 wherein:

said substrate includes hermetically sealed electrical feedthroughs for conducting electrical signals between the interior of said hermetically sealed enclosure and the region outside of said enclosure.

35. The system recited in claim 32 wherein:
said system includes a plurality of feedthrough electrical leads, each extending from within said hermetic enclosure to the outside;
at least one of said feedthrough leads is disposed on the upper surface of said substrate;
an electrically insulating sealing material over lies and hermetically seals said at least one feedthrough lead;
said continuous metal layer is disposed over said electrically insulating sealing material and hermetically sealed to it.

* * * * *